United States Patent
Aldrich et al.

(10) Patent No.: US 7,365,991 B2
(45) Date of Patent: Apr. 29, 2008

(54) DUAL LED BOARD LAYOUT FOR LIGHTING SYSTEMS

(75) Inventors: Matthew H. Aldrich, Arlington, VA (US); Jack C. Rains, Jr., Oak Hill, VA (US)

(73) Assignee: Renaissance Lighting, Herndon, VA (US)

( * ) Notice: Subject to any disclaimer, the term of this patent is extended or adjusted under 35 U.S.C. 154(b) by 4 days.

(21) Appl. No.: 11/403,840

(22) Filed: Apr. 14, 2006

(65) Prior Publication Data

US 2007/0242441 A1    Oct. 18, 2007

(51) Int. Cl.
*H05K 7/02* (2006.01)
*H05K 7/06* (2006.01)
*H05K 7/08* (2006.01)
*H05K 7/10* (2006.01)

(52) U.S. Cl. ............... 361/783; 361/782; 361/681; 361/808; 361/810; 362/240; 362/249; 362/252; 362/612; 257/88; 257/98; 257/99

(58) Field of Classification Search ........... 361/600, 361/681, 808, 810, 822, 782; 362/240, 800, 362/249, 252, 612, 231; 257/79, 80, 88, 257/94, 98, 99, 100
See application file for complete search history.

(56) References Cited

U.S. PATENT DOCUMENTS

| | | | |
|---|---|---|---|
| 5,453,849 A | 9/1995 | Copenhaver et al. | |
| 5,548,493 A | 8/1996 | Young | |
| 5,757,111 A | 5/1998 | Sato | |
| 5,803,592 A | 9/1998 | Lawson | |
| 5,877,490 A | 3/1999 | Ramer et al. | |
| 5,914,487 A | 6/1999 | Ramer et al. | |
| 6,007,209 A | 12/1999 | Pelka | 362/30 |
| 6,007,225 A | 12/1999 | Ramer et al. | |
| 6,016,038 A | 1/2000 | Mueller et al. | |
| 6,033,087 A * | 3/2000 | Shozo et al. | 362/244 |
| 6,150,774 A | 11/2000 | Mueller et al. | |
| 6,222,172 B1 | 4/2001 | Fossum et al. | 250/205 |
| 6,234,648 B1 | 5/2001 | Börner et al. | |

(Continued)

OTHER PUBLICATIONS

Phillips Lighting Co., LUMILEDS website, archived on the Wayback Machine Apr. 12, 2006.*

(Continued)

*Primary Examiner*—Tuan T. Dinh
*Assistant Examiner*—Sheldon Soon
(74) *Attorney, Agent, or Firm*—McDermott Will & Emery LLP

(57) ABSTRACT

Circuit boards for lighting systems have identical LED landing zones printed on the board. Each zone includes at least two sets of LED contact pads. One pad set is configured to mate with contacts of an LED of a first structural type, e.g. from a first product line or manufacturer. The other pad set is configured to mate with contacts of an LED of a second type, e.g. from a different product line or manufacturer. The layout may enable an easy system re-design, e.g. to shift from one type of LED to another. Alternatively, the layout may enable one system to use LEDs of the two different types in a single LED set or array. Exemplary systems disclosed herein include an element for mixing light produced by LEDs mounted to the landing zones, such as an optical integrating cavity.

28 Claims, 9 Drawing Sheets

U.S. PATENT DOCUMENTS

| | | |
|---|---|---|
| 6,357,889 B1 | 3/2002 | Duggal et al. ............... 362/84 |
| 6,441,558 B1 | 8/2002 | Muthu et al. |
| 6,454,437 B1* | 9/2002 | Kelly ........................ 362/246 |
| 6,607,794 B1 | 8/2003 | Wilson et al. |
| 6,657,393 B2* | 12/2003 | Natsume .................... 315/82 |
| 6,700,112 B2 | 3/2004 | Brown |
| 6,788,011 B2 | 9/2004 | Mueller et al. |
| 6,806,659 B1 | 10/2004 | Mueller et al. |
| 6,995,355 B2 | 2/2006 | Rains, Jr. et al. |
| 7,012,382 B2 | 3/2006 | Cheang et al. |
| 7,014,336 B1 | 3/2006 | Ducharme et al. |
| 7,108,413 B2 | 9/2006 | Kwong et al. ............. 362/583 |
| 7,144,131 B2 | 12/2006 | Rains |
| 7,145,125 B2 | 12/2006 | May et al. |
| 7,148,470 B2 | 12/2006 | Rains, Jr. et al. |
| 7,157,694 B2 | 1/2007 | May et al. |
| 7,178,941 B2* | 2/2007 | Roberge et al. ............ 362/225 |
| 2003/0031015 A1* | 2/2003 | Ishibashi ................... 362/249 |
| 2003/0072156 A1* | 4/2003 | Pohlert et al. ............. 362/244 |
| 2003/0076056 A1 | 4/2003 | Schuumans ................ 315/291 |
| 2003/0090910 A1* | 5/2003 | Chen ......................... 362/555 |
| 2004/0037088 A1* | 2/2004 | English et al. ............. 362/545 |
| 2004/0160199 A1 | 8/2004 | Morgan et al. ............. 315/312 |
| 2004/0228131 A1* | 11/2004 | Minano et al. ............. 362/307 |
| 2004/0264195 A1* | 12/2004 | Chang et al. ............... 362/294 |
| 2005/0156103 A1 | 7/2005 | May et al. |
| 2006/0072314 A1 | 4/2006 | Rains |
| 2006/0262544 A1 | 11/2006 | Piepgras et al. |
| 2006/0262545 A1 | 11/2006 | Piepgras et al. |

OTHER PUBLICATIONS

LEDTRONICS, inc., LEDTRONICS website, archived on the Wayback Machine Apr. 12, 2006.*
The LEDLIGHT.COM LLC, The LEDLIGHT.COM website, archived on the Wayback Machine Feb. 12, 2006.*
John Evans, Make Your Own Headlamp website, archived on the Wayback Machine Apr. 2, 2005.*
"Cree XLamp 3 7090 LEDs" Datasheet: CLD-DS03.001, pp. 1-6.
"Cree XLamp 7090 LEDs, XR Series" Datasheet: CLD-DS06.002, pp. 1-6.
"Assembly Information, Luxeon Emitter" Application Brief AB10, Lumileds, pp. 1-8.
"Custom Luxeon Design Guide" Application Brief AB12, Lumileds, pp. 1-14.

* cited by examiner

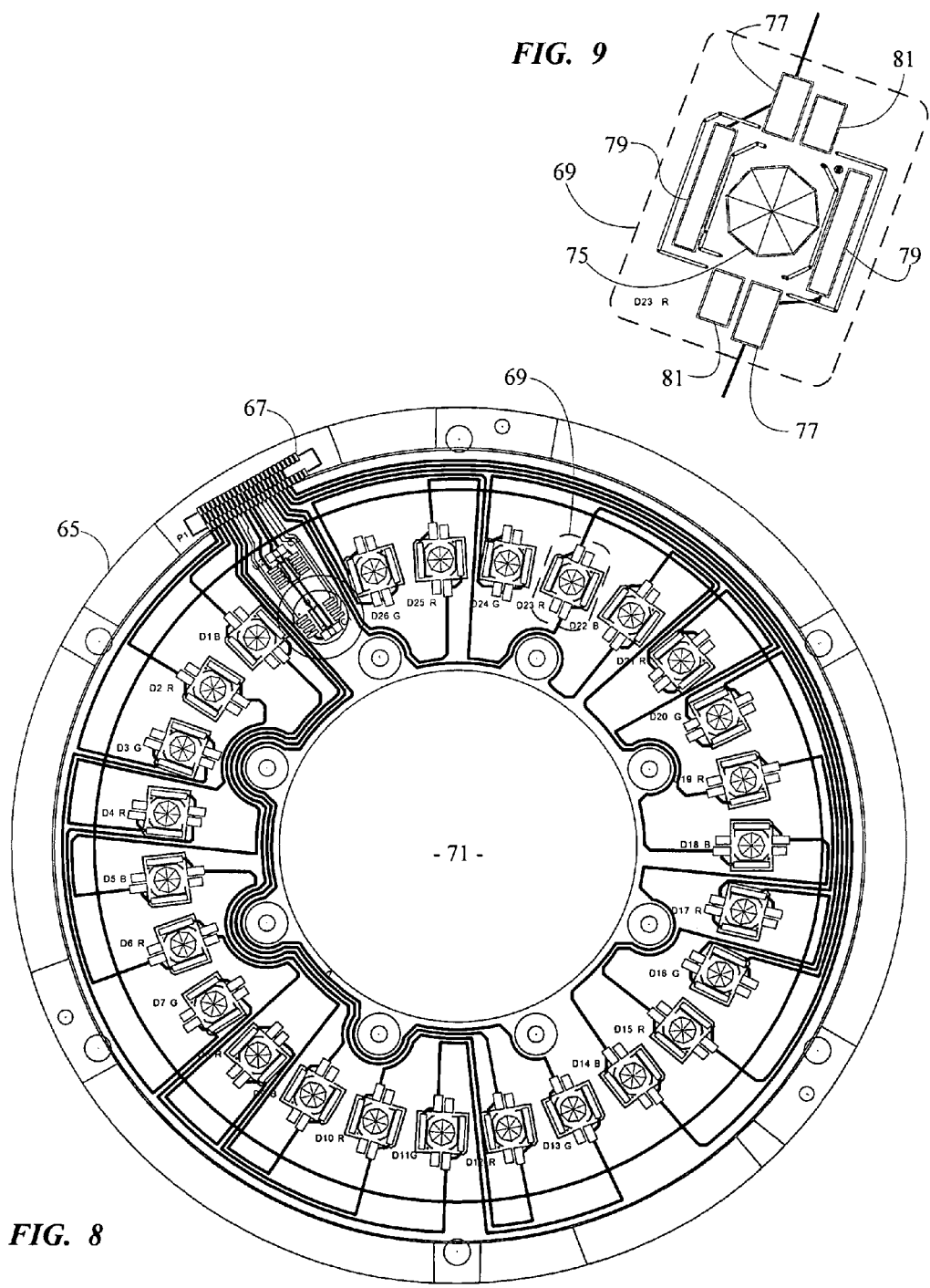

DUAL LED BOARD LAYOUT FOR LIGHTING SYSTEMS

TECHNICAL FIELD

The present subject matter relates to circuit boards having a landing zone layout to facilitate connection of two or more different types of LEDs and to circuitry and lighting systems using such circuit boards.

BACKGROUND

In recent years, improved light emitting diodes (LEDs) have become available that produce relatively high intensities of output light. These higher power LEDs, for example, have enabled use of LEDs in light fixtures and the like. The improving capability of LEDs and the decreasing cost of the LEDs is making LED based lighting a viable alternative to more traditional lighting, such as incandescent and florescent lights, and will soon allow LED lighting to surpass such older technologies.

For many lighting applications, the LED based fixture incorporates a circuit board supporting and providing electrical connections to a number of individually packaged LEDs. Often the LEDs are arranged in a fairly tight matrix array (see e.g. U.S. Pat. No. 6,016,038), although a variety of other arrangements are known. For example, U.S. Pat. No. 6,995,355 to Rains, Jr. et al. discloses lighting systems using circular or linear arrangements of LED sets as well as rectangular matrix arrangements and other position patterns. In the noted examples, the sets of LEDs have included LEDs configured for emitting different individual colors or wavelengths (e.g. red, green and blue), although the U.S. Pat. No. 6,995,355 patent also suggests inclusion of white LEDs or other white light sources. The red, green and blue light allows adjustment and control of the character of the combined light emitted by the system. As the quality of white LEDs continues to improve, newer lights will utilize similar arrangements of LEDs where all the LEDs are white LEDs.

Today there are many different types of LEDs available, that come in substantially different types of packages and require correspondingly different mounting and electrical connections. Most product lines include LEDs of many different colors, often including white LEDs, all in substantially the same configuration, e.g. with the same kind of housing and the same arrangement of contacts for electrical connection. However, each manufacturer packages their LEDs in a different manner, and many manufacturers offer different LED product lines having different structural configurations.

A printed circuit board for a LED light fixture is designed to match the configuration of one type of LEDs that will be mounted/connected on the board. For example, a board designed for a fixture that will utilize LEDs of a type from one manufacturer (of one color or of a number of different colors) would need to be redesigned in order for the fixture to utilize a different type of LED, such as from a different product line or as might be supplied by a different manufacturer. Also, it is difficult to include structurally different types of LEDs in a single LED set, particularly if the LEDs will be close to each other, because of the need to design different arrangements of contact pads and/or heat sinks on the board to accept each of the different types of LEDs.

Another issue relates to different outputs produced by different types of LEDs. In most lighting applications, it is desirable for the light to appear relatively homogeneous over the area illuminated by the fixture. LEDs usually are point sources. LED fixtures are often designed to reduce the apparent differences in the light output from the different point sources by mixing or combining the light outputs. However, the use of structurally different types of LEDs (e.g. from different manufacturers) often makes that aspect of fixture design more difficult as well.

A need exists for an improved LED board layout and/or improved lighting systems using such a board layout that will improve LED lighting with regard to one or more of the issues outlined above.

SUMMARY

The teachings herein alleviate one or more of the above noted problems with LED lighting by providing a board layout that enables a circuit board for an LED lighting application to readily accept two or more structurally different configurations of LED products. If the system will use a single type of LED at a given time, for example, it is a simple matter to change to the other different type of LED, without re-designing the circuit board. In other applications, the board design enables one lighting system to use one or more LEDs of each of the two structurally different types of LEDs, in a single LED set, which allows the designer considerably more flexibility in selecting LEDs for each lighting application.

The detailed description below discloses examples of printed circuit boards for use in lighting systems or the like. Such a board has a number of identical LED landing zones printed on the board. Each LED landing zone includes two sets of LED contact pads. One of the sets of contact pads is configured to mate with a first contact configuration for an LED of a first structural type. The other set of contact pads is configured to mate with a second contact configuration for an LED of a second structural type different from the first structural type, that is to say, of a type having a second contact configuration that is different from the first contact configuration.

Boards of this type may be used in a wide variety of LED lighting systems. Systems disclosed in the detailed description include an element for mixing light produced by LEDs mounted to the landing zones. In several examples, the mixing element includes an optical cavity having at least one transmissive path for emission of combined visible light from the cavity, although those skilled in the art will understand that systems using the board layout may utilize other light mixing technologies.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of the methodologies, instrumentalities and combinations particularly pointed out in the appended claims.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 8 is a plan view of a dual LED circuit board, having identical landing zones for twenty-six LEDs similar to those in the examples of FIGS. 3 and 4, but also showing terminals and wiring traces printed on the board.

FIG. 9 is an enlarged detail view of one of the LED landing zones on the circuit board of FIG. 8, but also showing the printed wiring connections to the contact pads of the landing zone.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings.

LED lighting systems are discussed below that utilize a circuit board for support of and electrical connection to structurally different types of LEDs, e.g. with different housings and/or contact lead configurations, without modification of the board. In many cases, such lighting systems can use structurally different LEDs at different locations on the board at the same time, as part of one lighting system design. In other cases, a system can be re-designed to use different LEDs without re-designing the board. The circuit board has identical LED landing zones, each of which includes at least two sets of LED contact pads. A first set of the contact pads is configured to mate with the contact configuration for a first structural type of LED. A second set of the contact pads is configured to mate with a second contact configuration for a LED of different second structural type.

In the examples, the first pads of the sets in a zone are connected together to wiring going to a terminal on the board. Similarly, the second pads of the sets in the LED landing zone are connected together to wiring going to a terminal. The terminals enable connection to control/driver circuitry for providing operating voltage and current for the LED when mounted in the zone and connected to one of the contact pad sets.

Although the board layouts discussed herein are applicable in other systems, in the system examples, one or more elements are provided to mix, combine or integrate light from the different LEDs mounted on the circuit board, to facilitate an overall lighting application of the system. Although other types of mixing may be used, a number of the examples utilize an optical integrating cavity or chamber. Hence, before discussion of examples of the board in detail, it may be helpful to first discuss a LED-based lighting system that combines the board, the LEDs and an optical integrating cavity.

Figure 1:
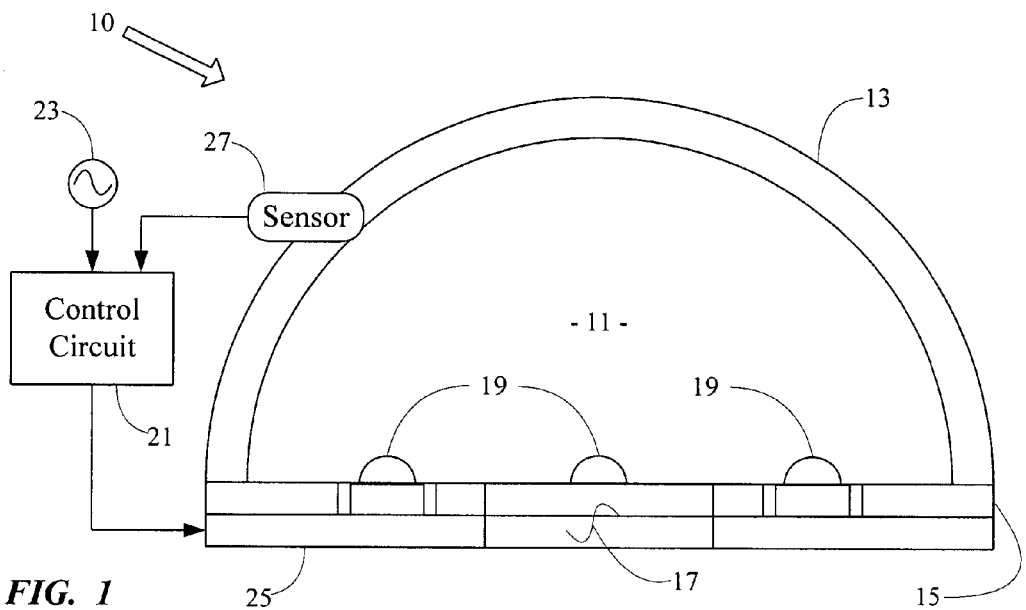
FIG. 1 illustrates a first example of a lighting system having a dual LED circuit board, with a portion of the cavity structure and board shown in cross-section.
Figure 2:
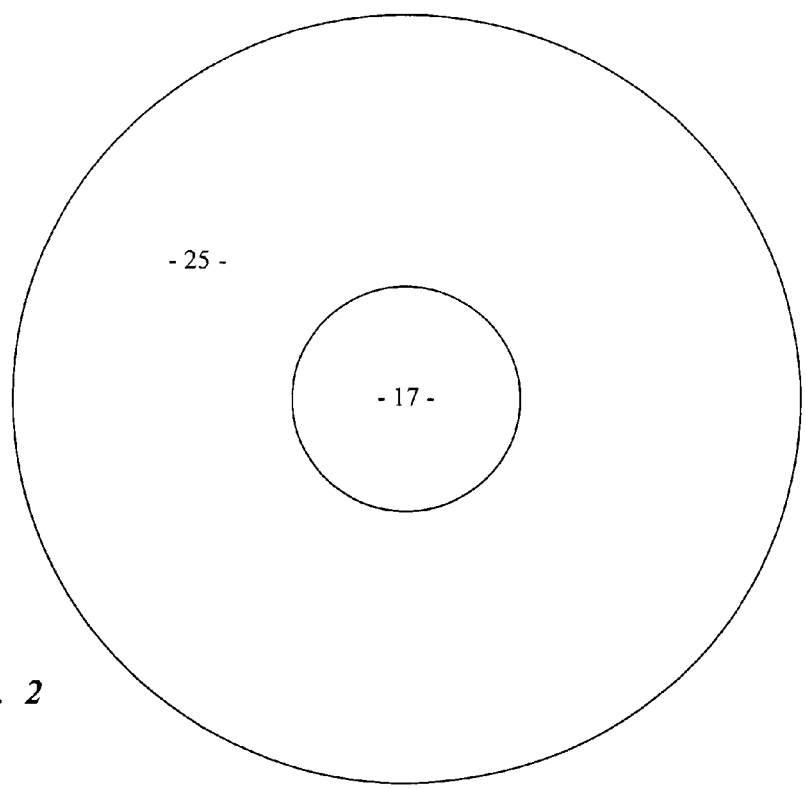
FIG. 2 is a bottom view of the light fixture, from the system of FIG. 1.

FIGS. 1 and 2 illustrate a lighting system 10 having a dual LED circuit board and an optical integrating cavity. The illustrated apparatus or system 10 provides light for visible luminance or illumination applications. The system 10 includes one or more elements to perform light mixing before emission in the direction required by the particular application. In this first example, the mixing is performed by an optical integrating cavity 11. The cavity 11 has a diffusely reflective interior surface, typically with a highly diffuse reflectivity. The cavity 11 may have various shapes. The illustrated cross-section would be substantially the same if the cavity is hemispherical or if the cavity is semi-cylindrical with the cross-section taken perpendicular to the longitudinal axis.

The disclosed apparatus may use a variety of different structures or arrangements for the integrating cavity 11. To achieve good mixing and performance, the cavity surface has a highly efficient diffusely reflective characteristic, e.g. a reflectivity of over 90%, with respect to the relevant wavelengths. In the example, the surface is highly diffusely reflective to energy in the visible, near-infrared, and ultra-violet wavelengths.

The cavity may be formed of a diffusely reflective plastic material, such as a polypropylene having a 98% reflectivity and a diffuse reflective characteristic. Such a highly reflective polypropylene is available from Ferro Corporation—Specialty Plastics Group, Filled and Reinforced Plastics Division, in Evansville, Ind. Another example of a material with a suitable reflectivity is SPECTRALON. TYVEK may be used to form a diffuse reflector. Alternatively, the integrating cavity may comprise a rigid substrate having an interior surface, and a diffusely reflective coating layer formed on the interior surface of the substrate so as to provide the diffusely reflective interior surface of the integrating cavity. The coating layer, for example, might take the form of a flat-white paint. A suitable paint might include a zinc-oxide based pigment, consisting essentially of an uncalcined zinc oxide and preferably containing a small amount of a dispersing agent. The pigment is mixed with an alkali metal silicate vehicle-binder, which preferably is a potassium silicate, to form the coating material. For more information regarding the paint, attention is directed to U.S. Pat. No. 6,700,112, by Matthew Brown.

For purposes of the discussion, the cavity 11 in the apparatus 10 is assumed to be hemispherical. When viewed from the bottom (FIG. 2) in the illustrated orientation, the fixture appears round. In the example, a hemispherical dome 13 and a substantially flat cover plate 15 form the cavity 11. At least the interior facing surfaces of the dome 13 and the cover plate 15 are highly diffusely reflective, so that the resulting integrating cavity 11 is highly diffusely reflective with respect to the radiant energy spectrum produced by the device 10. Although shown as separate elements, the dome and plate may be formed as an integral unit.

The integrating cavity 11 has an aperture 17 for allowing emission of combined radiant energy, typically visible light. The aperture may have any shape or position. There may be multiple apertures at various locations on the fixture. Also, one or more portions of the cavity wall may be at least partially transmissive with respect to visible light.

In the example, the aperture 17 is a passage through the approximate center of the cover plate 15 and the associated circuit board. Because of the diffuse reflectivity within the cavity 11, light within the cavity is integrated before passage out of the aperture 17. In the examples, the apparatus 10 is shown emitting the combined radiant energy downward through the aperture 17, for convenience. However, the apparatus 10 may be oriented in any desired direction to perform a desired application function, for example to provide visible luminance to persons in a particular direction or location with respect to the fixture or to illuminate a different surface such as a wall, floor or table top, provide indirect lighting, etc.

The apparatus 10 also includes light emitting diodes 19, as sources of radiant energy. The sources may emit light of similar color, e.g. white light; but in the example, the various LEDs 19 emit visible light energy of two or more different wavelengths, which in turn are integrated or combined within the cavity 11. The LEDs 19 supply radiant energy into the interior of the integrating cavity 11. In the example shown, the points of emission into the interior of the integrating cavity are not directly visible through the aperture 17.

At least two of the illustrated LEDs 19 emit radiant energy of different wavelengths. Additional LEDs of the same or different colors may be provided. The cavity 11 effectively integrates the energy of different wavelengths, so that the integrated or combined radiant energy emitted through the aperture 17 includes the radiant energy of all the various wavelengths in relative amounts substantially corresponding to the relative amounts input into the cavity from the various LED sources 19. The cavity 11 may also combine phosphor emissions from phosphors doped into a cavity wall and excited by energy from one or more of the LEDs 19, as will be discussed in more detail later with regard to FIG. 10.

The source LEDs 19 can include LEDs of any color or wavelength. Typically, a set of different color LEDs for a visible light application includes at least red, green, and blue LEDs, and/or blue or ultraviolet LEDs for exciting phosphors within the cavity structure. The set may also include one or more white LEDs. The integrating or mixing capability of the cavity 11 serves to project light of any color, including white light, by adjusting the amount of light output from the various sources coupled to the cavity. Hence, it is possible to precisely and repeatably control color rendering index (CRI), as well as color temperature. In fact it may be possible to achieve and maintain almost any color of light in the visible spectrum. The system works with the totality of light output from a family of LEDs 19. However, to provide color adjustment or variability, it is not necessary to control the output of individual LEDs, except as they contribute to the totality. Also, the distribution pattern of the individual LEDs and their emission points into the cavity are not significant. The LEDs 19 can be arranged in any manner to supply radiant energy within the chamber, although in most cases, the LED arrangement is intended to avoid direct view of the LEDS from outside the fixture.

In this example, the LED sources 19 extend into or through openings in the cover plate 15, so as to emit radiant energy directly into the interior of the integrating cavity 11. The LEDs may be located to emit light at points on the interior wall of the element 13, although typically such points would still be in regions out of the direct line of sight through the aperture 17. For ease of construction, however, the openings for the LEDs 19 are formed through the cover plate 15. On the plate, the openings/LEDs may be at any convenient locations.

The apparatus 10 also includes a control circuit 21 coupled to the LEDs 19 for establishing output of radiant energy of each of the LED sources. The control circuit 21 typically includes a power supply circuit coupled to a source, shown as an AC power source 23. The control circuit 21 also includes an appropriate number of LED driver circuits for controlling the power applied to each of the individual LEDs 19 and thus the intensity of radiant energy supplied to the cavity 11, e.g. for each different wavelength in this first example. The LEDs are mounted on a circuit board 25, and the driver circuits within the control 21 supply voltage and current to the LEDs 19 via circuit traces form on or within the structure of the board.

The control circuit 21 may control intensity of LED drive signals and thus intensity of the energy output from each LED 19. Alternatively or in combination, the control circuit 21 may modulate the drive signals in any one or more known ways, so as to control the light emissions. Examples of suitable modulation include pulse amplitude modulation, pulse position modulation and frequency modulation.

Control of the emissions from the LED light sources 19 sets a spectral characteristic of the combined radiant energy emitted through the aperture 17 of the integrating cavity 11. The control circuit 21 is responsive to one or more forms of user input, and in the example, the control circuit 21 is responsive to feedback from at least one sensor 27. A variety of sensing technologies may be used for the feedback. The sensor, for example, may be a temperature sensor. Typically, the sensor is or includes a light sensor for sensing the color characteristics of the combined light within the chamber 11. Sensing the light within the chamber 11 minimizes the effect of ambient light on the feedback. The color sensor may receive light from an aperture through a cavity wall, or it may be sufficient to position the sensor to detect light that permeates through a solid portion of the dome 13 or the plate 15. Specific examples of the control circuitry are discussed in more detail later.

Also, some of the LEDs 19 may be primary-initially active, whereas others are initially inactive 'sleepers.' The feedback enables control circuit 21 to activate one or more sleepers, as needed to achieve and/or maintain particular desired color performance and/or output performance.

In general, the apparatus or system 10 may take the form or use materials, circuit components, fixture configurations and/or additional light processing elements as discussed in greater detail in U.S. Pat. No. 6,995,355 to Rains, Jr. et al., the disclosure of which is entirely incorporated herein by reference.

In the example of FIGS. 1 and 2, the fixture portion of the system 10 emits visible light from the aperture 17. The aperture extends through the cover plate 15 as well as the printed circuit board 25. The inner surface of the aperture 17 may be reflective, at least through the plate 15 and possibly on the portion thereof formed by passage through the circuit board 25. As illustrated in FIG. 2, the board is the bottom element of the fixture. The board 25 may be covered by a housing, support plate or heat sink element (not shown). As disclosed in the Rains, Jr. et al. U.S. Pat. No. 6,995,355 patent, the system 10 may also include one or more optical processing elements, for processing the light that emerges through the aperture 17.

Figure 3:
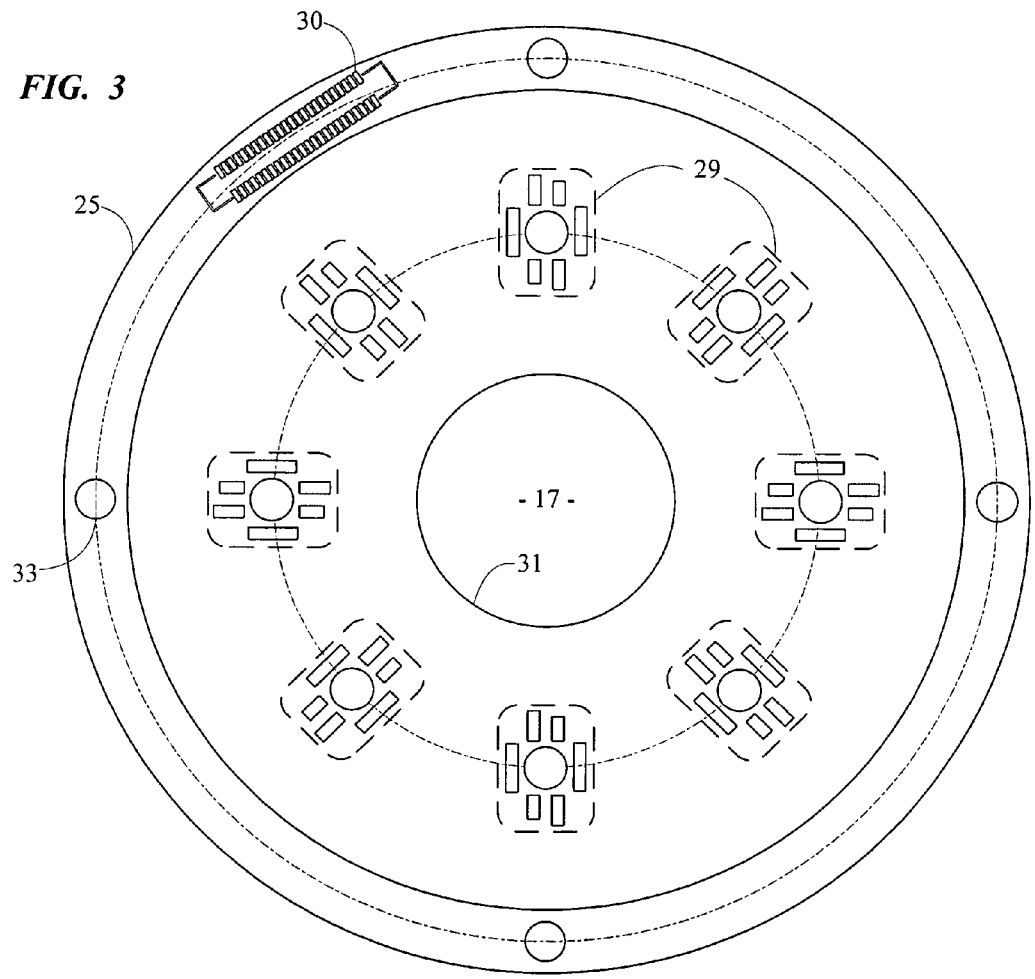
FIG. 3 is a plan view of a dual LED circuit board, such as might be used in the system of FIG. 1.

With that general description of the exemplary lighting system 10, we will now turn to a more detailed description of the dual LED layout provided by the circuit board 25 in our example. FIG. 3 is a plan view illustrating the layout of the landing zones 29 on the circuit board 25, before attachment of the LEDs 19. The illustration also shows a strip of terminals 30, for electrical connections to the control circuit 21, although the printed wiring leads or traces running between the terminals 30 and the contact pads in the landing zones 29 have been omitted for convenience (see FIGS. 8 and 9 which provide more a detailed illustration, albeit in an example intended for use with a larger number of LEDs).

In the simple symmetrical example of FIG. 3, the board 25 is round and has a circular central opening 31 forming a portion of the aperture 17 for light emission from the integrating cavity. The board 25 may have a number of mounting holes 33, such as shown by way of example at various points around the periphery of the board, although obviously other locations and arrangements of these holes or other board mounting elements may be used if such are desired for particular system constructions.

The board 19 supports a number of identical LED landing zones 29, corresponding to the maximum number of LEDs that may be included in the system 10. In the simple example, for discussion purposes here, the board 19 includes eight identical LED landing zones 29. An example of the board, having twenty-six such zones, is shown in FIG. 8. Fewer or more such zones 29 may be provided, depending on the size and desired output of the system. The locations and orientations of the zones 29 on the board 19 are purely arbitrary and will typically be chosen to best facilitate a particular application of the board in a lighting system. In the example, the LED landing zones 29 are at the same distance from and symmetrically spaced about the center of the board (and thus about the opening 31 for the aperture 17).

Commercially available LEDs for lighting system applications are available from numerous manufacturers, and some manufacturers offer structurally different models of LEDs. Different LED product types, whether from the same or different manufactures, typically have different housing structures and/or different lead or contact configurations for the necessary electrical connections. As a result, one type of LED will require a first arrangement of contact pads on a circuit board, for connection to the electrical leads extending from the housing of that type of LED, whereas another type of LED will require a second substantially different arrangement of contact pads on a circuit board, for connection to the electrical leads extending from the housing of that different type of LED. A third type of LED will require yet a further arrangement of contact pads on a circuit board, for connection to the electrical leads extending from the housing of that still further different type of LED, and so on and so forth for other LED product types. To facilitate use of at least two different types of LEDs, without re-designing the contact pad arrangements on the board, each of the landing zones 29 includes two or more sets of contact pads. Each different set of pads within the landing zone 29 is configured for use with a different type of LED, having different connection leads and/or a different housing structure.

Figure 4:
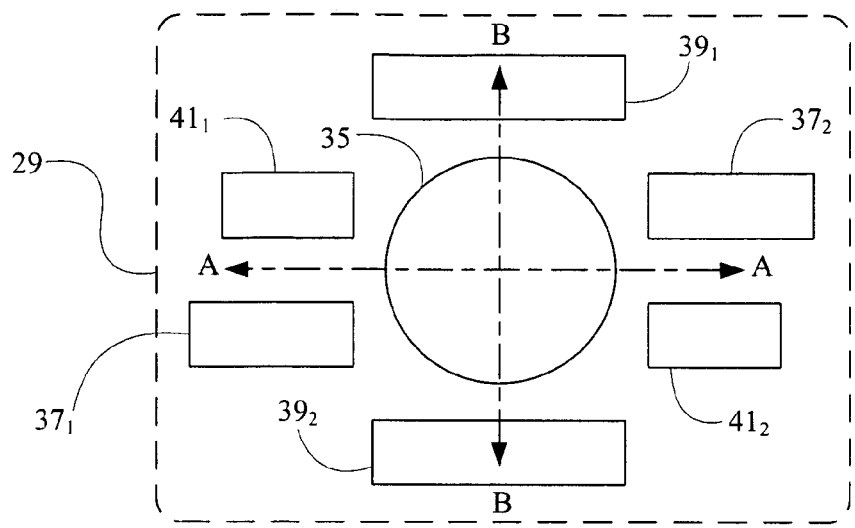
FIG. 4 is an enlarged detail view of one of the LED landing zones on the circuit board of FIG. 3.

FIG. 4 is an enlarged plan view of one of the identical LED landing zones 29 from the board 19 of FIG. 3. In the example, each landing zone 29 includes a central metal heat sink 35, for contacting the LED housing and conducting at least some heat away from the particular LED. The heat sink 35 may be printed on or embedded in the board so as to conduct heat to the opposite side of the board.

The landing zone 29 also includes at least two sets of LED contact pads 37 and 39 printed in a manner so as to be exposed on the surface of the board. The first of the two sets of LED contact pads $37_1$, $37_2$ is configured to mate with the first contact configuration for any LED of a first structural type, as will be discussed with regard to the example of FIG. 5. The contact pads $37_1$, $37_2$ are oriented along a first axis of the landing zone 29, represented by the arrow/line A-A passing between and through the centers of those pads in the example of FIG. 4. The second of the two sets of LED contact pads $39_1$, $39_2$ is configured to mate with the second contact configuration for any LED of a second structural type, as will be discussed with regard to the example of FIG. 6. The contact pads $39_1$, $39_2$ are oriented along a second axis of the landing zone 29, represented by the arrow/line B-B passing between and through the centers of those pads in the illustrated example. As such, the axis B-B of the second set of contact pads $39_1$, $39_2$ is perpendicular or orthogonal to the axis A-A of first of the two sets of LED contact pads $37_1$, $37_2$. On a circular board such as the board 25 of FIG. 3, the first axis A-A of each zone 29 would be radial. However, the perpendicular second axis B-B would always be tangential. As will be seen from a comparison of FIGS. 4 and 5, the orientation of the pairs of contact pads enables two different orientations of the two different types of LED devices.

The landing zone may include one or more additional sets of contact pads. In the example, the zone 29 includes a third set of LED contact pads $41_1$, $41_2$ configured to mate with a third contact configuration for any LED of yet another structural type. In the example, the third set of LED contact pads $41_1$, $41_2$ is oriented along the first axis of the landing zone 29, represented by the arrow A-A in the FIG. 4 although it could have other orientations.

An LED typically requires two electrical connections, one for an anode and one for a cathode, although other contact patterns are possible. The example, however, assumes that the various LED types have various configurations of anode-cathode contacts. The individual pairs of contact pads 37, 39 and 41 could have separate wiring within the board to respective ones of the terminals 30, so as to provide separate wiring for each anode and cathode contact. However, since each landing zone 29 typically connects to a single LED in any one system application, it may be sufficient to connect the pads of the contact pairs together, so that only two wiring connections are provided to each zone 29, one for the anode contact pads and one for the cathode contact pads. Hence, in the example, the circuit board 25 contains an electrical wiring lead (not visible in the drawings) for each zone 29 that connects in common to contact pads $37_1$, $39_1$, and $41_1$ in the respective zone, which might be used say for anode connections. Similarly, the exemplary circuit board 29 contains an electrical wiring lead (not visible in the drawings) for each zone 29 that connects in common to contact pads $37_2$, $39_2$ and $41_2$ in the respective zone, which might be used say for cathode connections.

Hence, each identical landing zone 29 can be used for a connection of either one of at least two (three in the example) structurally different types of LED packages. For example, the board 19 may be used in one application with all LEDs of one type, e.g. from one manufacturer and/or of one model type for a given application. For a different application (or due to different LED costs), another system design may call for LEDs of a different type. In many cases, however, the use of the landing zones 29 allows the board 25 be used in applications having at least two structurally different types of LED, e.g. at least one LED of one model or from one manufacture and at least one LED of a different model or from a different manufacturer. Further discussion of the examples will consider an application which uses a mixture of different LEDs, e.g. at least one Luxeon® Emitter type LED from Lumiled and at least one Cree® XLamp® type LED.

Figure 5:
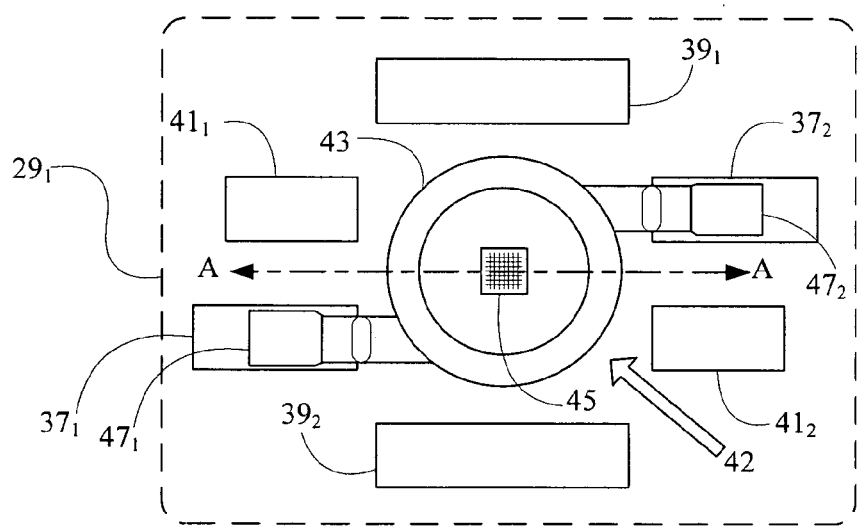
FIG. 5 is an enlarged detail view of one of the LED landing zones showing mounting/connection of a first type of LED on the landing zone.

FIG. 5 depicts one of the LED landing zones $29_1$ having a first type of LED mounted on the landing zone. The drawing shows a stylized representation of a Luxeon® Emitter type LED 42. As is typical, the LED package 42 includes a housing 43 enclosing a semiconductor chip 45, which actually comprises the semiconductor forming the LED device. An epoxy dome (or similar transmissive part) of the enclosure allows for emission of the light or other energy from the chip 45 in the desired direction.

The diode on the chip 45 typically has two electrical connections, e.g. an anode and a cathode, although some devices may require additional electrical connections. In the example, a first electrical contact $47_1$ provides an electrical connection for the anode of the light emitting diode on the chip 45; and a second electrical contact $47_2$ provides an electrical connection for the cathode of the light emitting diode on the chip 45. The drawing shows the first electrical contact $47_1$ electrically connected to the first contact pad $37_1$ of the first contact pair 37 within the landing zone $29_1$. Similarly, FIG. 5 shows the second electrical contact $47_2$ electrically connected to the second contact pad $37_2$ of the first contact pair 37 within the landing zone $29_1$. The electrical connection between each contact and the respective contact pad may be made by soldering (not visible in the drawing) or other convenient means. The electrical connections typically provide sufficient structural support to also serve to physically mount the LED 42 to the board 25.

Figure 6:
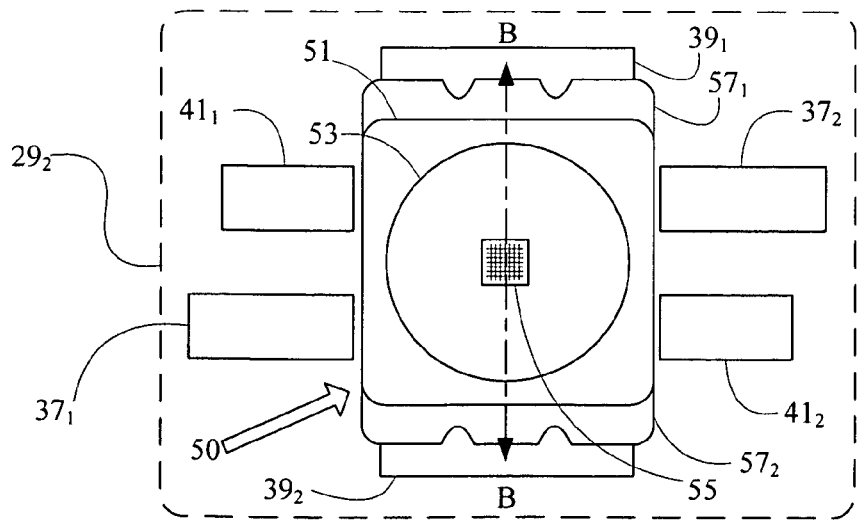
FIG. 6 is an enlarged detail view of one of the LED landing zones showing mounting/connection of a second type of LED on the landing zone.

FIG. 6 depicts a second one of the LED landing zones $29_2$ having a second type of LED on the landing zone. The drawing shows a stylized representation of a Cree® XLamp® type LED 50. This type of package has a reflector 51 mounted on a substrate. The reflector 51 encloses an epoxy dome (or similar transmissive part) that forms a lens 53 over the central portion of the reflector 51 and a semiconductor chip 55, which actually comprises the semiconductor forming the LED device. The substrate extends beyond the reflector 51 to form contact areas $57_1$ and $57_2$. Actually electrical contacts are formed on the areas $57_1$ and $57_2$ on the side of the substrate opposite the chip 55, and the substrate includes wiring from the chip for anode and cathode connections to the electrical contacts on the opposite face of the substrate in the contact areas $57_1$ and $57_2$.

In the example, the package for the LED 50 is oriented to place first contact area $57_1$ over the first contact pad $39_1$ of the second set of contact pads 39 and to place the second contact area $57_2$ over the second contact pad $39_2$ of the second set of contact pads 39. Solder reflow can be used to electrically connect the contacts on the undersides of areas $57_1$ and $57_2$ to the respective pads $39_1$ and $39_2$ of the second landing zone $29_2$. The solder or other electrical connection usually provides sufficient structural support to also serve to physically mount the LED 50 to the board 25.

In the example, the first type LED 42 has its electrical contacts 47 arranged along the radial axis A-A of first landing zone $29_1$ (in the same manner as the contact pads 37). By comparison, the second type LED 50 has its electrical contact under areas 57 arranged along the tangential axis B-B of second landing zone $29_2$ (in the same manner as the contact pads 39).

Figure 7:
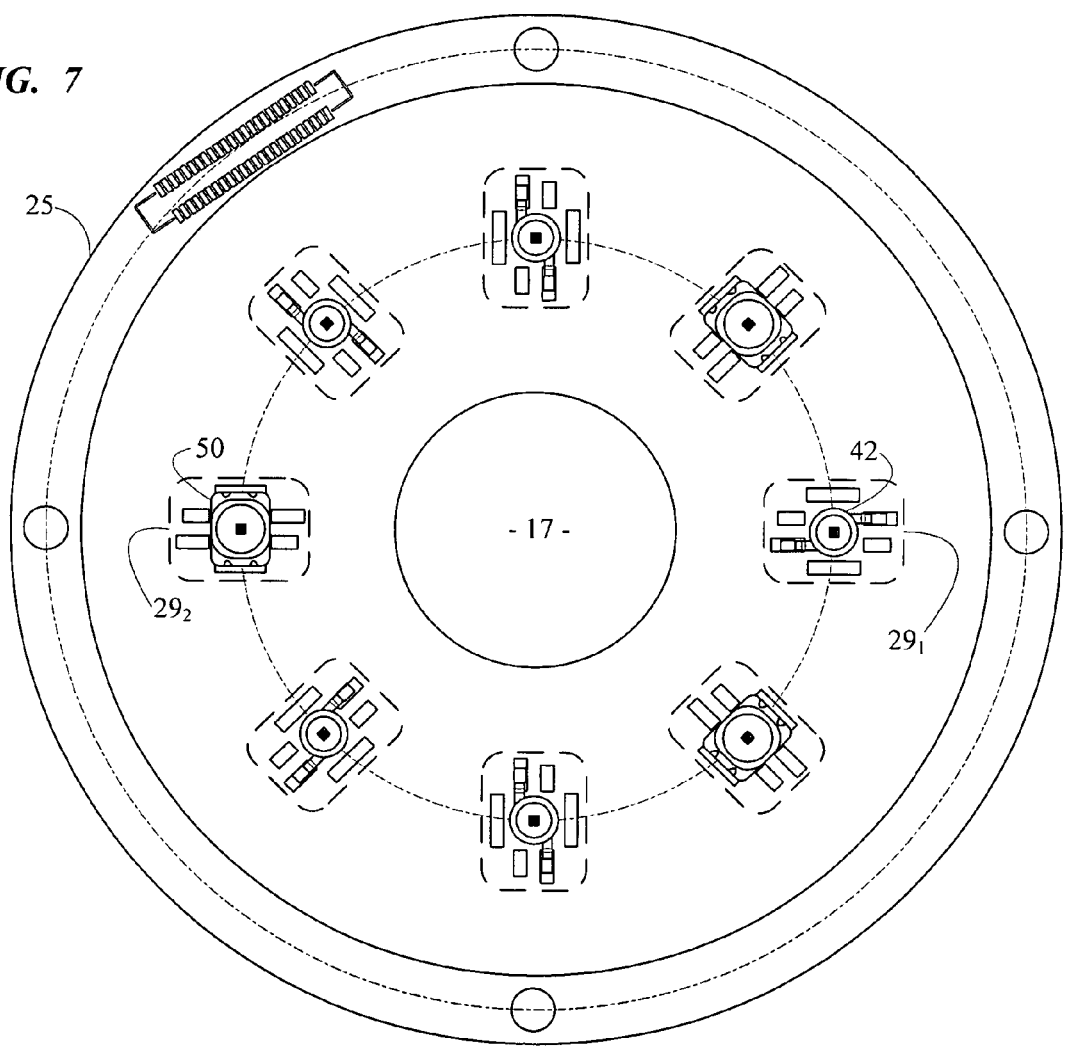
FIG. 7 is a plan view of a dual LED circuit board of FIG. 3, with LEDs of two different types mounted to various landing zones.

FIG. 7 shows a number of LEDs, of at least two different structural types, mounted on the landing zones 29 of the circuit board 25 to form an assembly for use in a lighting system, such as the system 10 of FIG. 1. This example includes the first landing zone $29_1$ on which is mounted one of the LEDs 42 of the first type and the second landing zone $29_2$ on which is mounted one of the LEDs 50 of the second type, essentially as discussed above relative to FIGS. 5 and 6. In an example having two different types of LEDs, like that shown, there typically will be a number of LEDs of each type on different zones 29 on the one board 25. In the simple eight zone example of FIG. 7, five of the landing zones have LEDs of the first type, and three of the landing zones have LEDs of the second type. Those skilled in the art will recognize, however, that any combination of different numbers of the two types and/or with other different types of LEDs are possible.

FIG. 8 is a plan view of a dual LED circuit board 65, having identical landing zones for twenty-six LEDs. The board 65 is generally similar to the board 25 in the earlier example. The board 65 includes a strip of terminals 67, for electrical connections to the control circuit 21, and electrical connections to the contact pads in the landing zones 69. In this example, the board 65 is round and has a circular central opening 71 forming a portion of the aperture for light emission from the integrating cavity.

As noted, the board 65 has twenty-six LED landing zones 69. The zones 69 are identical and are generally similar to the zones 29 in the earlier example. The zones are designated to receive twenty-six LEDs and thus are designated landing zones D1 to D26. In an initial application, the system will use a combination of red (R), green (G) and blue (B) LEDs, as indicated by the R, G and B notation associated with each of the zone identifiers D1 to D26. For example, the landing zone D1 B is expected to receive a blue LED, the zone D2 R is expected to receive a red LED, the zone D3 G is expected to receive a green LED, and so on. Those skilled in the art will recognize, however, that this arrangement of the zones and LEDs was chosen for a particular application in a particular system construction and is exemplary only. Obviously, other numbers, other arrangements on the board and other color combinations of LEDs may be used.

FIG. 9 is an enlarged detail view of one of the LED landing zones 69 from the circuit board 65 of FIG. 8, in this case, using the D23 R zone as a representative example. The drawing also shows the printed wiring connections to contact pads of the landing zone.

In the example, each landing zone 69 includes a central metal heat sink 75, for contacting the LED housing and conducting at least some heat away from the particular LED. The heat sink 75 may be printed on or embedded in the board so as to conduct heat to the opposite side of the board.

The landing zone 69 also includes at least two sets of LED contact pads 77 and 79 printed in a manner so as to be exposed on the surface of the board. The first of the two sets of LED contact pads 77 is configured to mate with the first contact configuration for any LED of a first structural type, similar to the above-discussed example of FIG. 5. The contact pads 77 are arranged generally along a radius of the board. The second of the two sets of LED contact pads 79 is configured to mate with the second contact configuration for any LED of a second structural type, similar to the above-discussed example of FIG. 6. An axis through the contacts 79 is approximately tangential. The landing zone 69 may include one or more additional sets of contact pads, represented by the example, the set of LED contact pads 81.

The example assumes that the various LED types have various configurations of anode-cathode contacts. The individual pairs of contact pads 77, 79 and 81 could have separate wiring within the board to respective ones of the terminals 70, so as to provide separate wiring for each anode and cathode contact. However, since each landing zone 69 typically connects to a single LED in any one system application, it may be sufficient to connect the pads of the contact pairs together, so that only two wiring connections are provided to each zone 69, one for the anode contact pads and one for the cathode contact pads. In this example, the circuit board 65 contains an electrical wiring lead for each zone 69 that connects in common to one contact pad 77 and to one contact pad 79 in the respective zone, which might be used say for anode connections. Similarly, the exemplary circuit board 69 contains an electrical wiring lead (not visible in the drawings) for each zone 69 that connects in common to the other contact pad 77 and the other contact pad 79 in the respective zone, which might be used say for cathode connections. Hence, each identical landing zone 69 can be used for a connection of either one of at least two structurally different types of LED packages, as in the examples of FIGS. 4 and 5.

To appreciate features and examples of the control circuitry 21 for driving and controlling the LEDs 19 on the board 25 outlined above, it may be helpful to consider specific examples with reference to appropriate diagrams.

Figure 10:
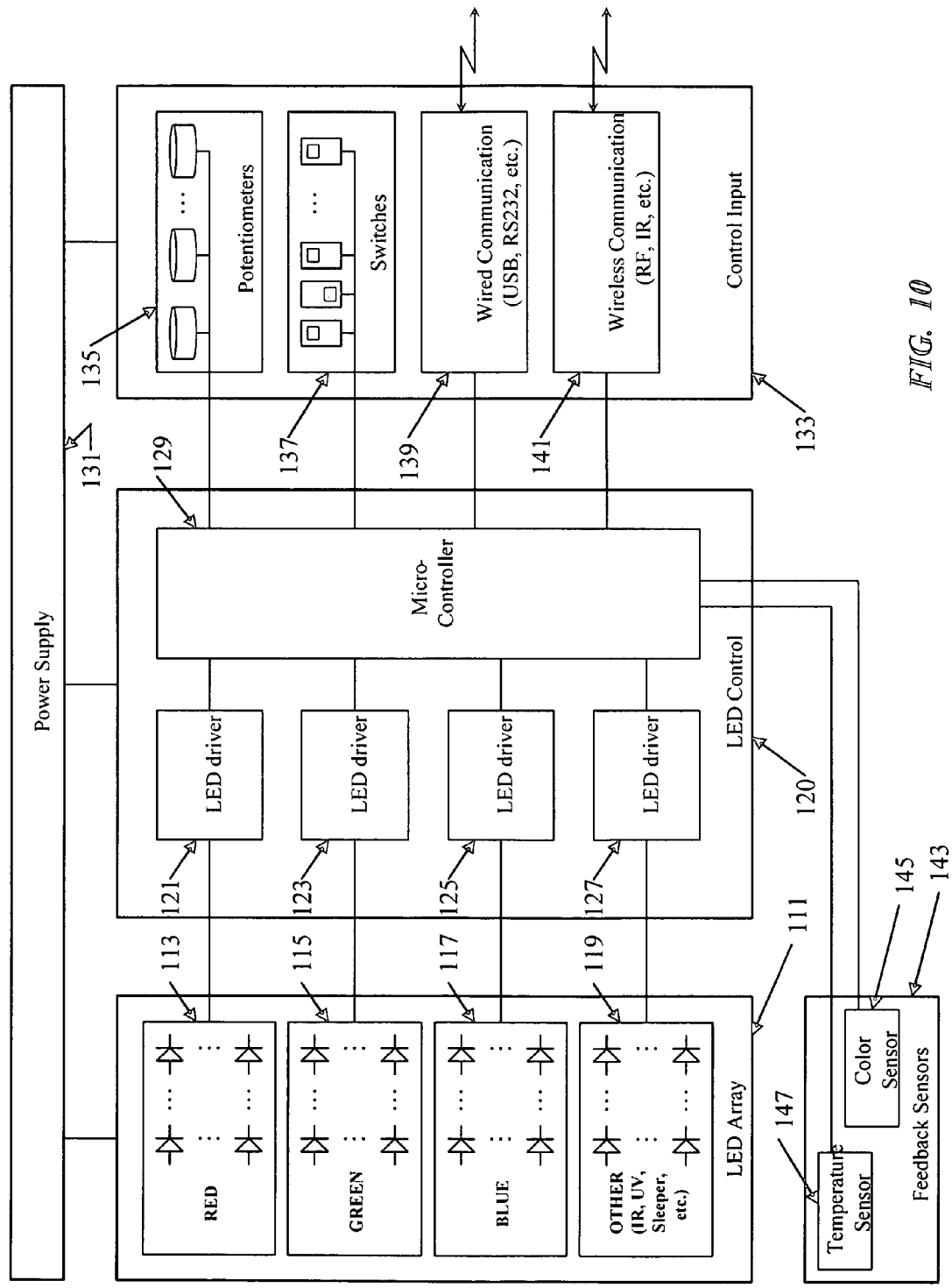
FIG. 10 is a functional block diagram of the electrical components, of one of the LED based lighting systems, using programmable digital control logic.

FIG. 10 is a block diagram of exemplary circuitry for the LED sources and associated control circuit, providing digital programmable control, which may be utilized with a light integrating fixture of the type described above relative to FIG. 1. In this circuit example, the diodes of one or more structural types takes the form of a LED set or array 111 mounted on a dual LED type board to form an assembly, such as shown in FIG. 7. Although the array 111 could contain LEDs of all one color, e.g. all white LEDs, the exemplary array 111 comprises two or more LEDs of each of the three primary colors red (R), green (G) and blue (B), represented by LED blocks 113, 115 and 117.

The LED array 111 assembled on a board 25 or 65 in this example also includes a number of additional or "other" LEDs 119. There are several types of additional LEDs that that may be provided. One type of additional LED provides one or more additional wavelengths of radiant energy for integration within the chamber. The additional wavelengths may be in the visible portion of the light spectrum, to allow a greater degree of color adjustment. Alternatively, the additional wavelength LEDs may provide energy in one or more wavelengths outside the visible spectrum, for example, in the infrared range or the ultraviolet range to excite phosphors doped into a wall of the cavity 11.

The second type of additional LED that may be included in the system is a sleeper LED. As discussed above, some LEDs would be initially active, whereas the sleepers would be inactive, at least during initial operation. Using the circuitry of FIG. 10 as an example, the Red LEDs 113, Green LEDs 115 and Blue LEDs 117 might normally be active. The LEDs 119 would be sleeper LEDs, typically including one or more LEDs of each color used in the particular system. The control logic activates the sleeper LEDs if and when needed.

The third type of other LED that may be provided is a white LED. For white lighting applications that still use primary color LEDs (RGB or CYM), one or more white LEDs provide increased intensity. The primary color LEDs then provide light for color adjustment and/or correction. If the other LEDs 119 include sleepers, there would typically be one or more white sleepers as well.

The electrical components shown in FIG. 10 also include a LED control system 120. The system 120 includes driver circuits for the various LEDs and a microcontroller. The driver circuits supply electrical current to the respective LEDs 113 to 119 to cause the LEDs to emit light. The driver circuit 121 drives the Red LEDs 113, the driver circuit 123 drives the green LEDs 115, and the driver circuit 125 drives the Blue LEDs 117. In a similar fashion, when active, the driver circuit 127 provides electrical current to the other LEDs 119. If the other LEDs provide another color of light, and are connected in series, there may be a single driver circuit 127. If the LEDs are sleepers, it may be desirable to provide a separate driver circuit 127 for each of the LEDs 119. The intensity of the emitted light of a given LED is proportional to the level of current supplied by the respective driver circuit.

The current output of each driver circuit is controlled by the higher level logic of the system, e.g. via digital to analog converters (not separately shown). In this digital control example, the logic is implemented by a programmable microcontroller 129, although those skilled in the art will recognize that the logic could take other forms, such as discrete logic components, an application specific integrated circuit (ASIC), etc.

The LED driver circuits and the microcontroller 129 receive power from a power supply 131, which is connected to an appropriate power source (not separately shown). For many lighting applications, the power source will be an AC line current source, however, some applications may utilize DC power from a battery or the like. The power supply 129 converts the voltage and current from the source to the levels needed by the driver circuits 121 127 and the microcontroller 129.

A programmable microcontroller typically includes or has coupled thereto random-access memory (RAM) for storing data and read-only memory (ROM) and/or electrically erasable read only memory (EEROM) for storing control programming and any pre-defined operational parameters, such as pre-established light 'recipes.' The microcontroller 129 itself comprises registers and other components for implementing a central processing unit (CPU) and possibly an associated arithmetic logic unit. The CPU implements the program to process data in the desired manner and thereby generate desired control outputs.

In the illustrated arrangement, the microcontroller 129 is programmed to control the LED driver circuits 121-127 to set the individual output intensities of the LEDs to desired levels, so that the combined light emitted from the aperture of the cavity has a desired spectral characteristic and a desired overall intensity. The microcontroller 129 may be programmed to essentially establish and maintain or preset a desired 'recipe' or mixture of the available wavelengths provided by the LEDs used in the particular system. The microcontroller 129 receives control inputs specifying the particular 'recipe' or mixture. To insure that the desired mixture is maintained, the microcontroller receives a color feedback signal from an appropriate color sensor. The microcontroller may also be responsive to a feedback signal from a temperature sensor, for example, in or near the optical integrating cavity.

The electrical system will also include one or more control inputs 133 for inputting information instructing the microcontroller 129 as to the desired operational settings. A number of different types of inputs may be used and several alternatives are illustrated for convenience. A given installation may include a selected one or more of the illustrated control input mechanisms.

As one example, user inputs may take the form of a number of potentiometers 135. The number would typically correspond to the number of different light wavelengths provided by the particular LED array 111. The potentiometers 135 typically connect through one or more analog to digital conversion interfaces provided by the microcontroller 129 (or in associated circuitry). To set the parameters for the integrated light output, the user adjusts the potentiometers 135 to set the intensity for each color. The microcontroller 129 senses the input settings and controls the LED driver circuits accordingly, to set corresponding intensity levels for the LEDs providing the light of the various wavelengths.

Another user input implementation might utilize one or more dip switches 137. For example, there might be a series of such switches to input a code corresponding to one of a number of recipes. The memory used by the microcontroller 129 would store the necessary intensity levels for the different color LEDs in the array 111 for each recipe. Based on the input code, the microcontroller 129 retrieves the appropriate recipe from memory. Then, the microcontroller 129 controls the LED driver circuits 121-127 accordingly, to set corresponding intensity levels for the LEDs 113-119 providing the light of the various wavelengths.

As an alternative or in addition to the user input in the form of potentiometers 135 or dip switches 137, the microcontroller 129 may be responsive to control data supplied from a separate source or a remote source. For that purpose, some versions of the system will include one or more communication interfaces. One example of a general class of such interfaces is a wired interface 139. One type of wired interface typically enables communications to and/or from a personal computer or the like, typically within the premises in which the fixture operates. Examples of such local wired interfaces include USB, RS-232, and wire-type local area network (LAN) interfaces. Other wired interfaces, such as appropriate modems, might enable cable or telephone line communications with a remote computer, typically outside the premises. Other examples of data interfaces provide wireless communications, as represented by the interface 141 in the drawing. Wireless interfaces, for example, use radio frequency (RF) or infrared (IR) links. The wireless communications may be local on-premises communications, analogous to a wireless local area network (WLAN). Alternatively, the wireless communications may enable communication with a remote device outside the premises, using wireless links to a wide area network.

As noted above, the electrical components may also include one or more feedback sensors 143 to provide system performance measurements as feedback signals to the control logic, implemented in this example by the microcontroller 129. A variety of different sensors may be used, alone or in combination, for different applications. In the illustrated examples, the set 143 of feedback sensors includes a color sensor 145 and a temperature sensor 147. Although not shown, other sensors, such as an overall intensity sensor may be used. The sensors are positioned in or around the system to measure the appropriate physical condition, e.g. temperature, color, intensity, etc.

The color sensor 145, for example, is coupled to detect color distribution in the integrated radiant energy. The color sensor may be coupled to sense energy within the optical integrating cavity, within an output deflector (if provided) or at a point in the field illuminated by the particular system. Various examples of appropriate color sensors are known. For example, the color sensor may be a digital compatible sensor, of the type sold by TAOS, Inc. Another suitable sensor might use the quadrant light detector disclosed in U.S. Pat. No. 5,877,490, with appropriate color separation on the various light detector elements (see U.S. Pat. No. 5,914,487 for discussion of the color analysis).

The associated logic circuitry, responsive to the detected color distribution, controls the output intensity of the various LEDs, so as to provide a desired color distribution in the integrated radiant energy, in accord with appropriate settings. In an example using sleeper LEDs, the logic circuitry is responsive to the detected color distribution to selectively activate the inactive light emitting diodes as needed, to maintain the desired color distribution in the integrated radiant energy. The color sensor measures the color of the integrated radiant energy produced by the system and provides a color measurement signal to the microcontroller 129. If using the TAOS, Inc. color sensor, for example, the signal is a digital signal derived from a color to frequency conversion.

The temperature sensor 147 may be a simple thermoelectric transducer with an associated analog to digital converter, or a variety of other temperature detectors may be used. The temperature sensor is positioned on or inside of the fixture, typically at a point that is near the LEDs or other sources that produce most of the system heat. The temperature sensor 147 provides a signal representing the measured temperature to the microcontroller 129. The system logic, here implemented by the microcontroller 129, can adjust intensity of one or more of the LEDs in response to the sensed temperature, e.g. to reduce intensity of the source outputs to compensate for temperature increases. The program of the microcontroller 129, however, would typically manipulate the intensities of the various LEDs so as to maintain the desired color balance between the various wavelengths of light used in the system, even though it may vary the overall intensity with temperature. For example, if temperature is increasing due to increased drive current to the active LEDs (with increased age or heat), the controller may deactivate one or more of those LEDs and activate a corresponding number of the sleepers, since the newly activated sleeper(s) will provide similar output in response to lower current and thus produce less heat.

Figure 11:
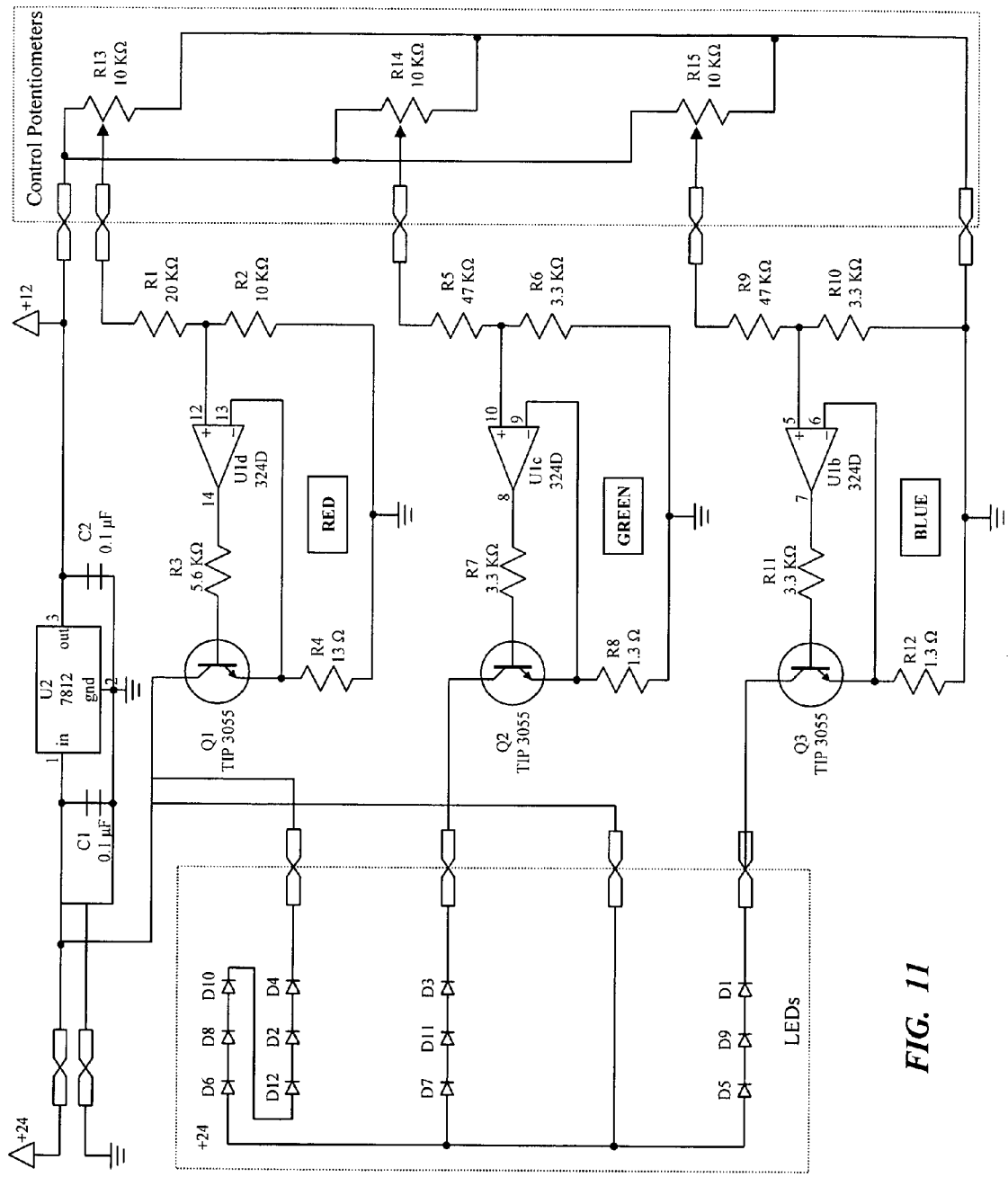
FIG. 11 is a circuit diagram showing the electrical components, of one of the systems, using analog control circuitry.

The above discussion of FIG. 10 related to programmed digital implementations of the control logic. Those skilled in the art will recognize that the control also may be implemented using analog circuitry. FIG. 11 is a circuit diagram of a simple analog control for a lighting apparatus (e.g. of the type shown in FIG. 1) using Red, Green and Blue LEDs. The user establishes the levels of intensity for each type of radiant energy emission (Red, Green or Blue) by operating a corresponding one of the potentiometers. The circuitry essentially comprises driver circuits for supplying adjustable power to two or three sets of LEDs (Red, Green and Blue) and analog logic circuitry for adjusting the output of each driver circuit in accord with the setting of a corresponding potentiometer. Additional potentiometers and associated circuits would be provided for additional colors of LEDs. Those skilled in the art should be able to implement the illustrated analog driver and control logic of FIG. 11 without further discussion.

In the examples of FIGS. 10 and 11, the control circuitry controlled the intensity of the currents driving the LEDs, to control the amounts of energy output by the various LEDs. Those skilled in the art will appreciate that the circuit may also control output amounts by modulating the drive signals and controlling parameters of the modulation, e.g. amplitude and/or pulse position or width.

Systems using the control circuitry described above have a wide range of applications, where there is a desire to set or adjust color provided by a lighting fixture. These include task lighting applications, signal light applications, as wells as applications for illuminating an object or person. Some lighting applications involve a common overall control strategy for a number of the systems.

Figure 12:
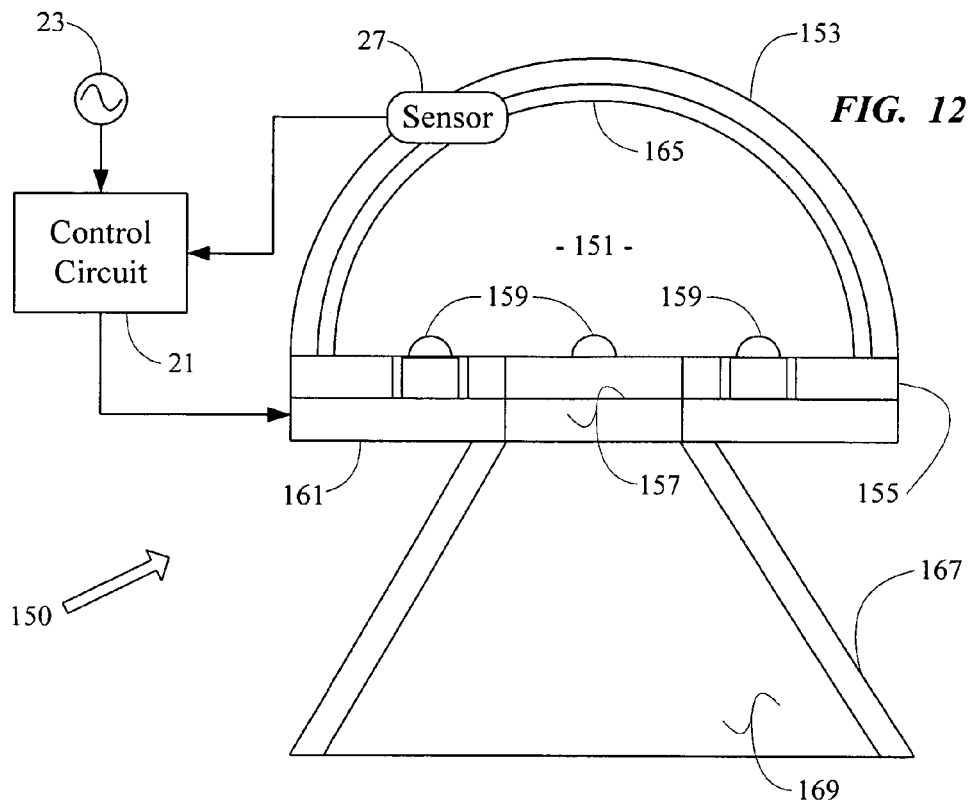
FIG. 12 illustrates a second example of a lighting system having a dual LED circuit board, partially in cross-section, wherein the board would be similar to that of FIGS. 3 and 7, the fixture includes phosphor doping of a portion of the cavity, and the system further includes a conical deflector as an example of an element for optical processing of the combined light emissions.

FIG. 12 illustrates an example of another lighting system 150 having a dual LED circuit board. The system 150 is similar to the system 10 in that it includes an optical integrating cavity 151 in the form of a dome 153 and cover plate 155 with a central aperture 157, that are generally similar in shape and construction to the cavity, dome, plate and aperture in system 10. The second system example 150 also includes LEDs 159, generally similar to those discussed above relative to the earlier examples, although here, some of the LEDs 159 may have somewhat different emissions, for purposes of exciting phosphors used in the system 150. The system 150 includes a dual layout LED board 163 similar to or even the same as the board 25 or the board 65.

The system 150 includes a control circuit 21 and power source 23, to control the operation and amounts of output of the various LEDs 159. The individual light outputs determine the amount of light processed in the chamber 151. A sensor 27 provides feedback, e.g. of color of light from within the cavity 151. The sensor 27, control circuit 21 and power source 23 function in essentially the same manner as in the other examples.

The system 150 incorporates one or more phosphors, as dopant(s) in or coatings on one or more of the macro scale reflective elements of the fixture (as opposed to micro elements within the LED packages themselves). Although other elements may be so treated with phosphor(s), in the example, the dome 153 is doped or coated to provide a treated layer 165 adjacent to the diffusely reflective inner surface thereof forming the upper portion of the cavity wall. The plate 155 may be doped in a similar manner, but for ease of illustration and discussion, only the dome 153 is doped in this example.

A phosphor is any of a number of substances that exhibit luminescence when struck by radiant energy of certain wavelength(s). To provide desired color outputs, for example, it is increasingly common for the source packages to include phosphors at various locations to convert some of the chip output energy to more desirable wavelengths in the visible light spectrum. At least some energy from one or more of the LEDs 159 excites the phosphor(s) in layer 165 to emit additional light within the cavity 151, for combination and emission through the aperture 157.

At least some radiant energy of a first wavelength, emitted from one of the LEDs 151, impacts on the reflective surface of cavity 151, including the layer 165 on the dome 153. This energy excites the phosphor dopant within the material forming the layer 165 to emit visible light. The emitted light comprises visible light energy of at least one second wavelength different from the first wavelength. At least some of visible light emitted by the phosphor is reflected by the reflective surface of the dome 153 and the plate 155 within the cavity 151 and integrated or combined with other light with the cavity 151, typically from one or more of the LEDs 159. The lighting system 150 directs at least the visible light from the phosphor, emitted through the aperture 157, as part of a combined light emission that can be perceived by a person.

As outlined above, phosphors absorb excitation energy then re-emit the energy as radiation of a different wavelength than the initial excitation energy. For example, some phosphors produce a down-conversion referred to as a "Stokes shift," in which the emitted radiation has less quantum energy and thus a longer wavelength. Other phosphors produce an up-conversion or "Anti-Stokes shift," in which the emitted radiation has greater quantum energy and thus a shorter wavelength. Such energy shifts can be used to produce increased amounts of light in desirable portions of the spectrum. For example, by converting UV light to visible light, the shift increases system efficiency for visible illumination of luminance applications. The shift provided by the phosphors may also help to enhance the white light characteristics of the visible output, e.g. by conversion of some blue light emitted by a Blue or White LED.

In one system incorporating one or more blue LEDs (center frequency of 460 nm), the phosphors in the layer 165 may be from the green-yellow $Ce^{3+}$ doped garnet family (e.g. $(Y, Gd)_3AL_5O_{12}$). An alternative approach that results in even better color generation and white light of any color temperature adds green and red phosphors (e.g., $SrGa_2S_4$: $Eu^{2+}$ and $SrS:Eu^{2+}$). As light from one or more blue LEDs is mixed in the optical system formed by phosphors in the layer 165, the phosphors are excited and emit light over a broad spectrum that when added in the optical chamber 151 allows for the creation of extremely high quality (e.g., desirable CRI and color temperature) white light.

If one or more UV LEDs are used as the LEDs 159, a blue phosphor (e.g., $Sr_2P_2O_7$), is added to the reflective material in addition to the green and red phosphors. Excitation of the various phosphors by the UV energy from the LED(s) produces blue, red and green light over a broad spectrum. The phosphor emissions are combined in the optical system formed by the layer 165 to produce extremely high quality (e.g., desirable CRI and color temperature) white light.

United States Patent Application Publication No. 20060072314 to Jack Rains provides additional examples of system arrangements that may utilize LEDs and phosphors for lighting applications, and the entire disclosure of that Publication is incorporated herein by reference.

Of note for purposes of this discussion, one or more of the LEDs 159 assembled on or with the board 161 is of a type chosen to excite phosphors within the layer 165. Typically, there will be one or more other LEDs emitting light that does not necessarily excite the phosphors but is combined in a desirable way with the phosphor emissions by the integrating function of the cavity 151. The board 161 has a layout similar to that discussed above, e.g. with regard to FIGS. 3 and 8. For example, LEDs for phosphor excitation may be of one type and connected to one set of the contact pads in respective landing zones, whereas other LEDs providing other desired light emissions may be of a second type and connected to another set of the contact pads of the respective landing zones, essentially as discussed above relative to FIGS. 5-7. The board 161 may also be used to support LEDs of one structural type, for a particular application or system design.

As in the example of FIG. 1, the aperture 157 may serve as the system output, directing integrated color light to a desired area or region to be illuminated. Although not shown in this example, the aperture 157 may have a grate, lens or diffuser (e.g. a holographic element) to help distribute the output light and/or to close the aperture against entry of moisture or debris. For some applications, lighting systems 10 or 150 may include one or more additional optical processing elements, e.g. to mix, distribute and/or limit the light output over a desired field of illumination. To provide an example, the system 150 is shown with a deflector as an exemplary element for optically processing light emitted through the aperture 157.

In the example, the lighting system also includes a conical deflector 167 having a reflective inner surface 169, for directing most of the light emerging from an aperture 157 into a relatively narrow field of view. A small opening at a proximal end of the deflector is coupled to the aperture 157 of the optical integrating cavity 151. The deflector 167 has a larger opening at a distal end thereof. The angle and distal opening of the conical deflector 167 define an angular field of radiant energy emission from the apparatus 150. Although not shown, the large opening of the deflector may be covered with a transparent plate or lens, or covered with a grating, to prevent entry of dirt or debris through the cone into the system and/or to further process the output radiant energy.

The conical deflector 167 may have a variety of different shapes, depending on the particular lighting application. In the example, where cavity 151 is hemispherical, the cross-section of the conical deflector is typically circular. However, the deflector may be somewhat oval in shape. In applications using a semi-cylindrical cavity, the deflector may be elongated or even rectangular in cross-section. The shape of the aperture 157 also may vary, but will typically match the shape of the small end opening of the deflector 167. Hence, in the example the aperture 157 would be circular. However, for a device with a semi-cylindrical cavity and a deflector with a rectangular cross-section, the aperture may be rectangular.

The deflector 167 comprises a reflective interior surface 169 between the distal end and the proximal end. In some examples, at least a substantial portion of the reflective interior surface 169 of the conical deflector 167 exhibits specular reflectivity with respect to the integrated radiant energy. As discussed in U.S. Pat. No. 6,007,625, for some applications, it may be desirable to construct the deflector 167 so that at least some portions of the inner surface 169 exhibit diffuse reflectivity or exhibit a different degree of specular reflectivity (e.g. quasi-specular), so as to tailor the performance of the deflector 65 to the particular application.

For other applications, it may also be desirable for the entire interior surface 169 of the deflector 65 to have a diffuse reflective characteristic. In such cases, the deflector 167 may be constructed using materials and/or phosphor dopants similar to those taught above for construction of the optical integrating cavity 11.

In the illustrated example, the large distal end of the deflector 167 is roughly the same size as the cavity 151. In some applications, this size relationship may be convenient for construction purposes. However, a direct relationship in size of the distal end of the deflector and the cavity is not required. The large end of the deflector may be larger or smaller than the cavity structure. As a practical matter, the size of the cavity 151 is optimized to provide the integration or combination of light colors from the desired number of LED sources 159 and the phosphor dopants generating light within the cavity 151. The size, angle and shape of the deflector 167 in turn determine the area that will be illuminated by the combined or integrated light emitted from the cavity 151 via the aperture 157.

Figure 13:
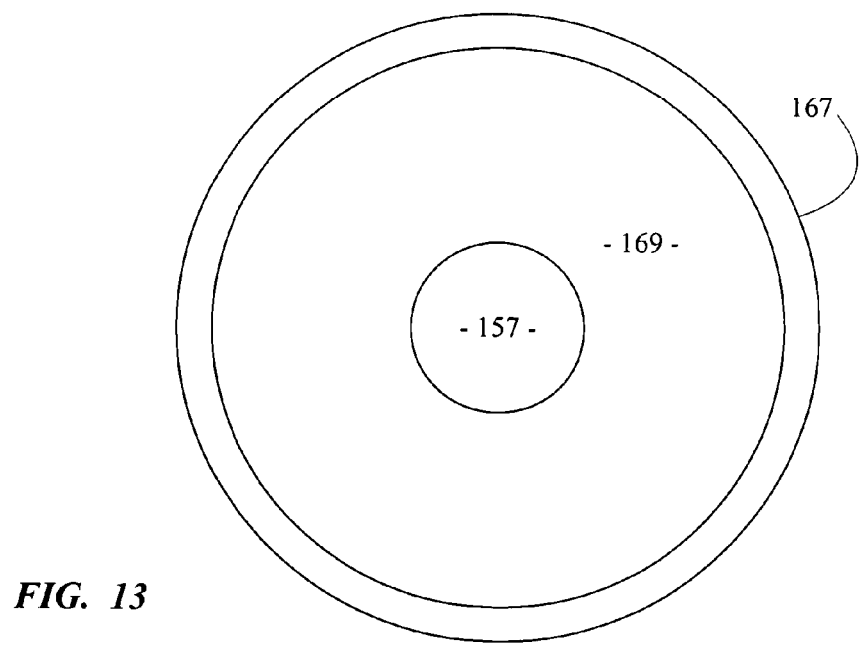
FIG. 13 is a bottom view of the light fixture, from the system of FIG. 12.

FIG. 13 is an end view of the fixture of system 150. As shown, when not illuminated, the aperture 157 and the reflective surface 169 of the deflector 167 are visible. However, assuming highly diffuse reflectivity within the cavity 151 (whether doped as in system 150 or not as in system 10), and assuming specular reflectivity on the surface 169, the entire planar area across the system output (essentially the entire distal aperture of the deflector 167) will appear as a uniform diffuse light source. Stated another way, with a diffuse cavity and specular reflector, the final system output aperture provided by the large distal opening of the deflector 167 will be substantially Lambertian.

Those skilled in the art will recognize that a variety of other optical processing elements may be used with or in place of the deflector 167. For discussion of additional examples, attention is directed to the U.S. Pat. No. 6,995,355 patent incorporated earlier.

Figure 14:
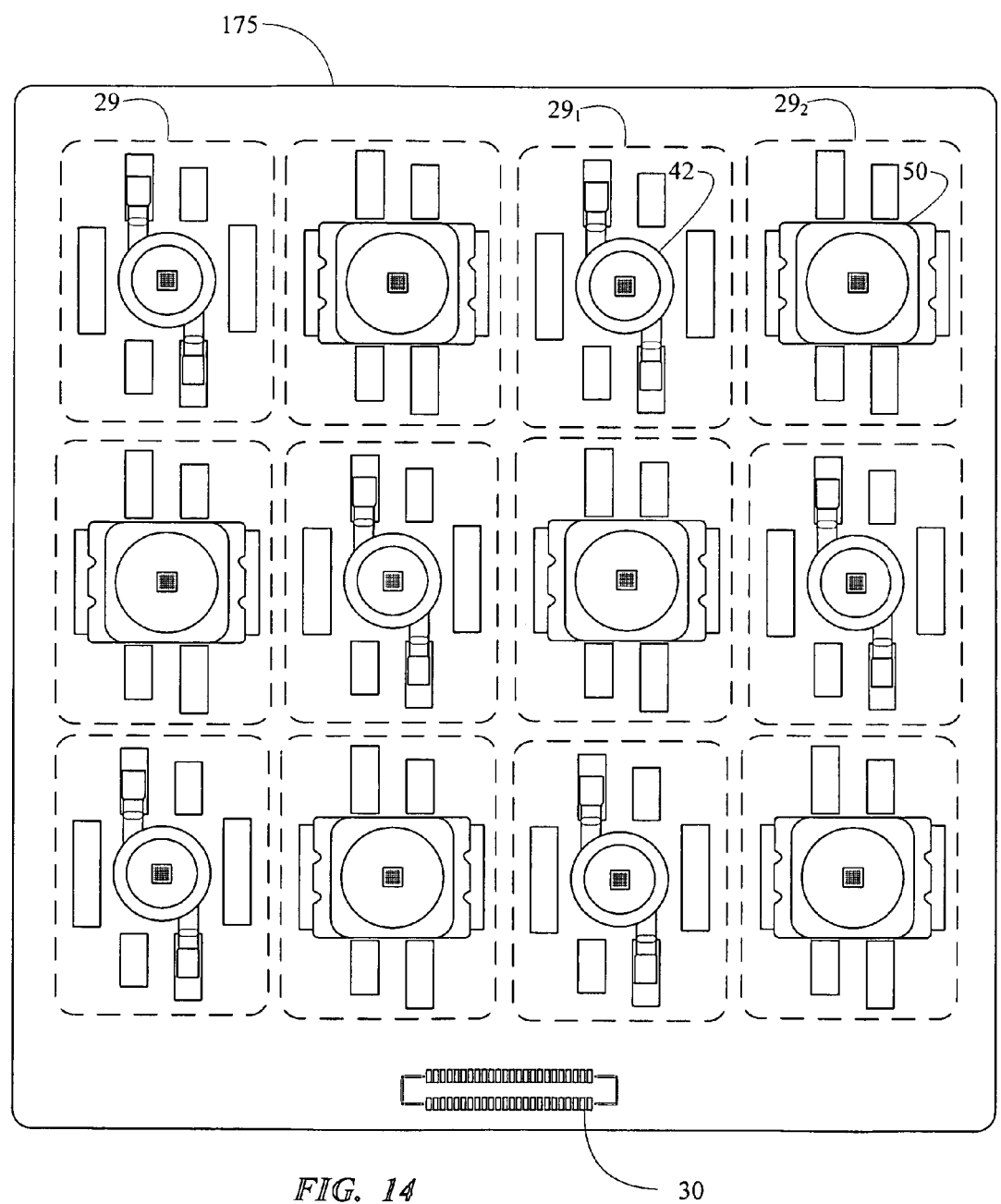
FIG. 14 is a plan view of a dual LED circuit board having different types of LEDs mounted/connected to the landing zones, wherein the landing zones provide a rectangular matrix arrangement of the LEDs.

FIG. 14 is a plan view of another example 175 of a dual LED layout type circuit board. Although the landing zone design could be different, for ease of discussion, the board 175 has a number of identical landing zones 29 similar to those in the example of FIGS. 3-7. The board 175 has different types of LEDs mounted/connected to the landing zones 29. Several of the landing zones $29_1$ have LEDs 42 of the first type, whereas other landing zones $29_2$ have LEDs 50 of the second type. Although not shown, the board 175 provides printed circuit wiring from the contact pads in the zones 29 to terminals 30, as in the earlier example. Of not for purposes of this discussion, the board 175 provides a rectangular matrix arrangement of the landing zones 29 and thus of the different structural types of LEDs.

Those skilled in the art will recognize that the teachings outlined above may be modified and expanded in a variety of ways to adapt the disclosed systems to various humanly perceptible lighting applications. For example, each landing zone may have two, three, four or more sets of contact pads designed for different LED structures and various orientations with each zoned. The LEDs of different structural types may emit the same or different colors of light. The LEDs of the same structural type may emit the same or different colors of light. One or more of the sets of contact pads in a zone may have a higher number of contacts, than the two contacts in the exemplary contact pairs, to accommodate other LED structures or packages. Also, most of the discussions above assumed that substantially all radiant energy impacting on various reflective surfaces (e.g. of the cavity and/or an external reflector) was either reflected or served to excite the phosphor dopants for reemission in direction(s) similar to reflections. For some applications, however, it may be desirable to allow some degree of transmissivity through one or more of the reflectors, to provide light emission in another direction or toward another desired area of intended illumination.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A printed circuit board for use in a lighting system, comprising:
   a board;
   a plurality of identical lighting emitting diode (LED) landing zones printed on the board, wherein:

each of the identical LED landing zones includes two sets of LED contact pads, a first of the two sets of LED contact pads is configured to mate with a first contact configuration for a LED of a first structural type, a second of the two sets of LED contact pads is configured to mate with a second contact configuration for a LED of a second structural type different from the first structural type, the second contact configuration is different from the first contact configuration, within each identical LED landing zone: the first set of LED contact pads is arranged along a first axis, and the second set of LED contact pads is arranged along a second axis substantially orthogonal to the first axis, a portion of the board supporting the identical LED landing zones is circular;

a line between two pads of the first set of LED contact pads is substantially non-tangential with respect to the circular portion of the board; and a line between two pads of the second set of LED contact pads is substantially tangential with respect to the circular portion of the board.

2. The printed circuit board of claim 1, wherein the board has a central aperture for passage of light.

3. The printed circuit board of claim 1, wherein the board further comprises:

a plurality of electrical terminals for electrical signals to drive the LEDs; and printed wiring extending from the electrical terminals to the contact pads in each the landing zones.

4. The printed circuit board of claim 1, wherein each identical LED landing zone further comprises:

a third set of LED contact pads configured to mate with a third contact configuration for an LED of a third structural type of LED different from the first and second structural types of LEDs; and the third contact configuration is different from the first and second contact configurations.

5. The printed circuit board of claim 3, wherein the printed wiring extending to each respective one of the landing zones comprises:

a first wiring lead connected to a first one of the contact pads in the first set and to a first one of the contact pads in the second set; and a second wiring lead connected to a second one of the contact pads in the first set and to a second one of the contact pads in the second set.

6. An assembly for use in a lighting system, comprising:

a board;

a plurality of identical lighting emitting diode (LED) landing zones printed on the board, wherein:

each of the identical LED landing zones includes two sets of LED contact pads, a first of the two sets of LED contact pads is configured to mate with a first contact configuration for a LED of a first structural type, a second of the two sets of LED contact pads is configured to mate with a second contact configuration for a LED of a second structural type different from the first structural type, the second contact configuration is different from the first contact configuration, within each identical LED landing zone: the first set of LED contact pads is arranged along a first axis, and the second set of LED contact pads is arranged along a second axis substantially orthogonal to the first axis, a portion of the board supporting the identical LED landing zones is circular;

a line between two pads of the first set of LED contact pads is substantially non-tangential with respect to the circular portion of the board; and a line between two pads of the second set of LED contact pads is substantially tangential with respect to the circular portion of the board; and a plurality of LEDs mounted on respective landing zones, contacts of each LED being connected to a set of the contact pads of the respective landing zone.

7. The assembly of claim 6, wherein all of the LEDs mounted on the landing zones are of only one of the structural types.

8. The assembly of claim 6, wherein:

a first of the LEDs is of the first structural type and is connected to the first set of contact pads in a first one of the landing zones; and a second of the LEDs is of the second structural type and is connected to the second set of contact pads in a second one of the landing zones.

9. The assembly of claim 8, wherein:

the first LED is a LED of a first color, and the second LED is a LED of a second color different from the first color.

10. The assembly of claim 8, wherein the first and second LEDs both emit visible light.

11. The assembly of claim 8, wherein at least one of the first and second LEDs emits light of a wavelength for exciting a phosphor to emit visible light.

12. The assembly of claim 8, wherein the first and second LEDs emit light of substantially the same color.

13. The assembly of claim 8, wherein:

the first LED is from one manufacturer and has a first housing configuration, and the second LED is from a different manufacturer and has a second housing configuration different from the first housing configuration.

14. The assembly of claim 12, wherein the first and second LEDs both emit substantially white light.

15. An apparatus for emitting light, comprising:

an optical cavity having at least one transmissive path for emission of combined visible light from the cavity;

a plurality of light emitting diodes (LEDs) for emission of light and for thereby producing visible light for combination within the cavity, wherein a first one of the LEDs is of a first structural type having contacts arranged in a first configuration and a second one of the LEDs is of a second structural type different from the first structural type having contacts arranged in a second contact configuration different from the first contact configuration; and a circuit board for support of and electrical connection to the LEDs; the circuit board comprising a plurality of identical LED landing zones, wherein:

each of the identical LED landing zones includes two sets of LED contact pads formed on the circuit board, a first of the two sets of LED contact pads is configured to mate with the first contact configuration for any LED of the first structural type, a second of the two sets of LED contact pads is configured to mate with the second contact configuration for any LED of the second structural type, within each identical LED landing zone: the first set of LED contact pads is arranged along a first axis, and the second set of LED contact pads is arranged along a second axis substantially orthogonal to the first axis, a portion of the board supporting the identical LED landing zones is circular, within each respective LED landing zone, a line between two pads of the first set of LED contact pads is substantially non-tangential with respect to the circular portion of the board, within each respective LED landing zone, a line between two pads of the second set of LED contact pads is substantially tangential with respect to the circular portion of the board, the first LED is mounted on the circuit board at a first one of the LED landing zones, and electrical connections to the first LED are made via the first set of LED contact pads of the first LED landing zone, and the second LED is mounted on the circuit board at a second one of the LED landing zones, and electrical connections to the second LED are made via the second set of LED contact pads of the second LED landing zone.

16. The apparatus of claim 15, wherein:

the first LED is a LED of a first color, and the second LED is a LED of a second color different from the first color.

17. The apparatus of claim 15, wherein the first and second LEDs both emit visible light.

18. The apparatus of claim 15, wherein:

the system further comprises a phosphor for emission of visible light for combination in the cavity; and at least one of the first and second LEDs emits light of a wavelength for exciting the phosphor to emit visible light.

19. The apparatus of claim 15, wherein the first and second LEDs emit light of substantially the same color.

20. The apparatus of claim 19, wherein the first and second LEDs both emit substantially white light.

21. The apparatus of claim 15, wherein:

the first LED is from one manufacturer and has a first housing configuration, and the second LED is from a different manufacturer and has a second housing configuration different from the first housing configuration.

22. The apparatus of claim 15, wherein the board has a central opening extending through the board, forming a portion of an aperture of the cavity for the at least one transmissive path for emission of combined visible light from the cavity.

23. The apparatus of claim 15, wherein the board further comprises:

a plurality of electrical terminals for electrical signals to drive the LEDs; and printed wiring extending from the electrical terminals to the contact pads in each the landing zones.

24. The apparatus of claim 15, wherein each identical LED landing zone further comprises:

a third set of LED contact pads configured to mate with a third contact configuration for an LED of a third structural type of LED different from the first and second structural types of LEDs; and the third contact configuration is different from the first and second contact configurations.

25. The apparatus of claim 15, wherein:

the apparatus comprises a wall having an inner surface forming the cavity;

the inner surface of the wall has a reflective property with respect to at least visible light; and the wall has an aperture forming a transmissive path for emission of combined visible light from the cavity.

26. The apparatus of claim 23, wherein the printed wiring extending to each respective one of the landing zones comprises:

a first wiring lead connected to a first one of the contact pads in the first set and to a first one of the contact pads in the second set; and a second wiring lead connected to a second one of the contact pads in the first set and to a second one of the contact pads in the second set.

27. The apparatus of claim 25, wherein the inner surface of the wall has a diffusely reflective property with respect to the light emitted by the LEDs.

28. The apparatus of claim 25, further comprising an optical processing element coupled to the aperture of the cavity for further processing of combined visible light emitted from the cavity.

* * * * *